United States Patent
Tramet et al.

(10) Patent No.: US 10,355,564 B2
(45) Date of Patent: Jul. 16, 2019

(54) ELECTRONIC ARCHITECTURE INTENDED TO SUPPLY AN ELECTRIC MACHINE FOR AUTOMOTIVE VEHICLE

(71) Applicant: Valeo Systemes de Controle Moteur, Cergy—Pontoise (FR)

(72) Inventors: Guillaume Tramet, Montesson (FR); Arnaud Mas, Cergy (FR); Ernesto Sacco, Cergy (FR)

(73) Assignee: Valeo Systemes de Controle Moteur, Cergy-Pontoise (FR)

( * ) Notice: Subject to any disclaimer, the term of this patent is extended or adjusted under 35 U.S.C. 154(b) by 259 days.

(21) Appl. No.: 15/364,419

(22) Filed: Nov. 30, 2016

(65) Prior Publication Data
US 2017/0163130 A1 Jun. 8, 2017

(30) Foreign Application Priority Data
Dec. 2, 2015 (FR) ...................... 15 61732

(51) Int. Cl.
*H02K 11/33* (2016.01)
*B60R 16/03* (2006.01)
(Continued)

(52) U.S. Cl.
CPC .............. *H02K 11/33* (2016.01); *B60R 16/03* (2013.01); *H02K 5/08* (2013.01); *H02K 11/048* (2013.01); *H05K 7/1432* (2013.01); *H05K 7/209* (2013.01)

(58) Field of Classification Search
CPC ........ H02K 11/33; H02K 5/08; H02K 11/048; H02K 5/225; H02K 15/14; H02K 9/22;
(Continued)

(56) References Cited

U.S. PATENT DOCUMENTS

2006/0181162 A1* 8/2006 Pierret ..................... H02K 9/20
310/58
2013/0187497 A1* 7/2013 Kato .................... H02K 11/048
310/71
(Continued)

FOREIGN PATENT DOCUMENTS

FR 3010590 A1 3/2015

OTHER PUBLICATIONS

French Translation (Year: 2013).*
Preliminary Search Report issued in corresponding French Patent Application No. 1561732, dated Jul. 7, 2016 (2 pages).

*Primary Examiner* — Mandeep S Buttar
(74) *Attorney, Agent, or Firm* — Osha Liang LLP (57) ABSTRACT

The subject of the invention is an electronic architecture (10) intended to supply an electric machine for automotive vehicle, the electronic architecture (10) comprising at least:
an electronic power unit (100);
a thermal dissipator (200) supporting the electronic power unit (100);
an electronic control unit (300) configured to control the said electronic power unit (100);
a support (400) of the electronic control unit supporting the electronic control unit (300) and arranged between the electronic power unit (100) and the electronic control unit (300); and
an electrical connector (500) comprising at least one power trace intended to be connected electrically to at least some electrical elements (phase φ, B⁺, B⁻) of the electric machine and/or of an electrical energy source, the electrical connector (500) being arranged between the electronic power unit (100) and the support (400) of the electronic control unit and configured to electrically
(Continued)

connect the electronic power unit (100) and/or the electronic control unit (300) to the at least one power trace.

8 Claims, 6 Drawing Sheets

(51) Int. Cl.
  *H02K 5/08* (2006.01)
  *H02K 11/04* (2016.01)
  *H05K 7/14* (2006.01)
  *H05K 7/20* (2006.01)

(58) Field of Classification Search
  CPC .. B60R 16/03; B60R 16/0231; H05K 7/1432; H05K 7/209; H05K 3/284; H05K 7/14; H05K 1/0203; H05K 1/0209; H05K 1/144; H05K 2203/1327; H05K 5/069; H05K 7/20836; H05K 7/20854; Y02T 10/7077
  USPC ......... 361/688, 719; 701/22; 180/53.5, 65.1, 180/65.285
  See application file for complete search history.

(56) References Cited

U.S. PATENT DOCUMENTS

| 2014/0009016 A1* | 1/2014 | Seidenbinder | H01L 25/16 310/64 |
| 2014/0265664 A1* | 9/2014 | Camilleri | H02K 15/14 310/59 |

* cited by examiner

ELECTRONIC ARCHITECTURE INTENDED TO SUPPLY AN ELECTRIC MACHINE FOR AUTOMOTIVE VEHICLE

The subject of the invention is an electronic architecture intended to supply an electric machine for automotive vehicle. The invention also relates to an electric machine intended to be integrated into an automotive vehicle and comprising such an electronic architecture.

Usually, an electronic architecture intended to supply an electric machine, notably for automotive vehicle, can comprise a plurality of electronic units, also called electronic modules, the electronic units being, for example, electronic power, excitation or control units. Each electronic unit comprises a box in which the electronics is integrated, the boxes of the electronic units being directly integrated within the electronic architecture. However, in such an electronic architecture, the power electronics and the control electronics are adjacent at the level of the support of the electronic units, and this may induce disturbances at the level of the operation of the electronic architecture. Indeed, the heat generated by the electronic power units can disturb the operation of the electronic control unit. Moreover, the box of each electronic unit can impair the dissipation of the heat generated by each electronic unit. Furthermore, as each electronic unit comprises a box, such an electronic architecture requires significant room within the electronic architecture in which it is intended to be integrated.

The present invention is aimed at remedying this drawback by proposing an electronic architecture allowing efficient dissipation of the heat generated within the electronic architecture, while minimizing the bulkiness of the latter.

For this purpose, the subject of the invention is an electronic architecture intended to supply an electric machine for automotive vehicle, the electronic architecture comprising at least:
  an electronic power unit;
  a thermal dissipator supporting the electronic power unit;
  an electronic control unit configured to control the said electronic power unit;
  a support of the electronic control unit supporting the electronic control unit and arranged between the electronic power unit and the electronic control unit; and
  an electrical connector comprising at least one power trace intended to be connected electrically to at least some electrical elements of the electric machine and/or of an electrical energy source, the electrical connector being arranged between the electronic power unit and the support of the electronic control unit and configured to electrically connect the electronic power unit and/or the electronic control unit to the at least one power trace.

Advantageously, the decoupling of the electronic control and power units within the electronic architecture allows efficient dissipation of the heat generated by the electronic units.

Furthermore, such an electronic architecture allows a reduction in production costs, notably by virtue of a reduction in the costs of fabrication of the electronic control unit which is insulated from the electronic power unit, and consequently distant from the heat generated by the said electronic power unit. Indeed, such an electronic architecture allows the use of components for the electronic control unit which require a lower tolerance to heat, and which are consequently less expensive.

The electronic architecture according to the invention can also comprise one or more of the following characteristics, considered individually or according to all the possible combinations:
  the electronic power unit, the thermal dissipator, the electrical connector, the electronic control unit and the support of the electronic control unit each extend along substantially parallel planes, the electronic power unit, the thermal dissipator and the electrical connector being notably superposed one above the other;
  the electrical connector comprises:
    a first power trace intended to electrically connect the electronic power unit to a phase of the electric machine;
    a second power trace intended to be connected electrically to a positive polarity pole of an electrical energy source so as to supply the electronic power unit and/or the electronic control unit; and
    a third power trace intended to be connected electrically to a negative polarity pole or to the earth of an electrical energy source so as to supply the electronic power unit and/or the electronic control unit;
  the electronic architecture furthermore comprises at least one electrical connection element electrically connecting the electronic power unit and the electronic control unit; and in which at least one space extends between the electronic power unit and the support of the electronic control unit and around the at least one electrical connection element, the said electrical connector extending at least in part in the said space around the electrical connection element;
  the electronic architecture also comprises a capacitor bank connector supported by a second part of the thermal dissipator distinct from a first part supporting the electronic power unit;
  the first part of the thermal dissipator is intended to be filled with an insulating material, so that the electronic power unit is embedded in the insulating material;
  the electronic power unit, the electronic control unit and the at least one electrical connection element are embedded in an insulating material, so that the at least one space extending around the at least one electrical connection element between the electronic power unit and the support of the electronic control unit is devoid of insulating material;
  the electronic architecture also comprises a protective cover arranged opposite the electronic control unit;
  the electronic power unit comprises at least one electronic power module, and the electronic control unit is an electronic control board.

Advantageously, such an electronic architecture allows efficient dissipation of the heat generated by the electronic units, notably by virtue of the space devoid of insulating material between the said electronic units.

Furthermore, such an architecture allows a reduction in production costs, notably by virtue of a reduction in the quantity of insulating material required in order to insulate the electronic units and the electrical connection elements of the said electronic units.

The subject of the invention is also an electric machine intended to be integrated into an automotive vehicle comprising an electronic architecture according to the invention. For example, the electric machine is a starter, a starter-alternator or another electric machine onboard the vehicle.

Other characteristics and advantages of the present invention will become apparent on reading the description and the following figures:

It should be noted that these drawings have no other aim than to illustrate the text of the description and do not in any way constitute a limitation of the scope of the invention.

In the various figures, analogous elements are designated by identical references.

Figure 6:
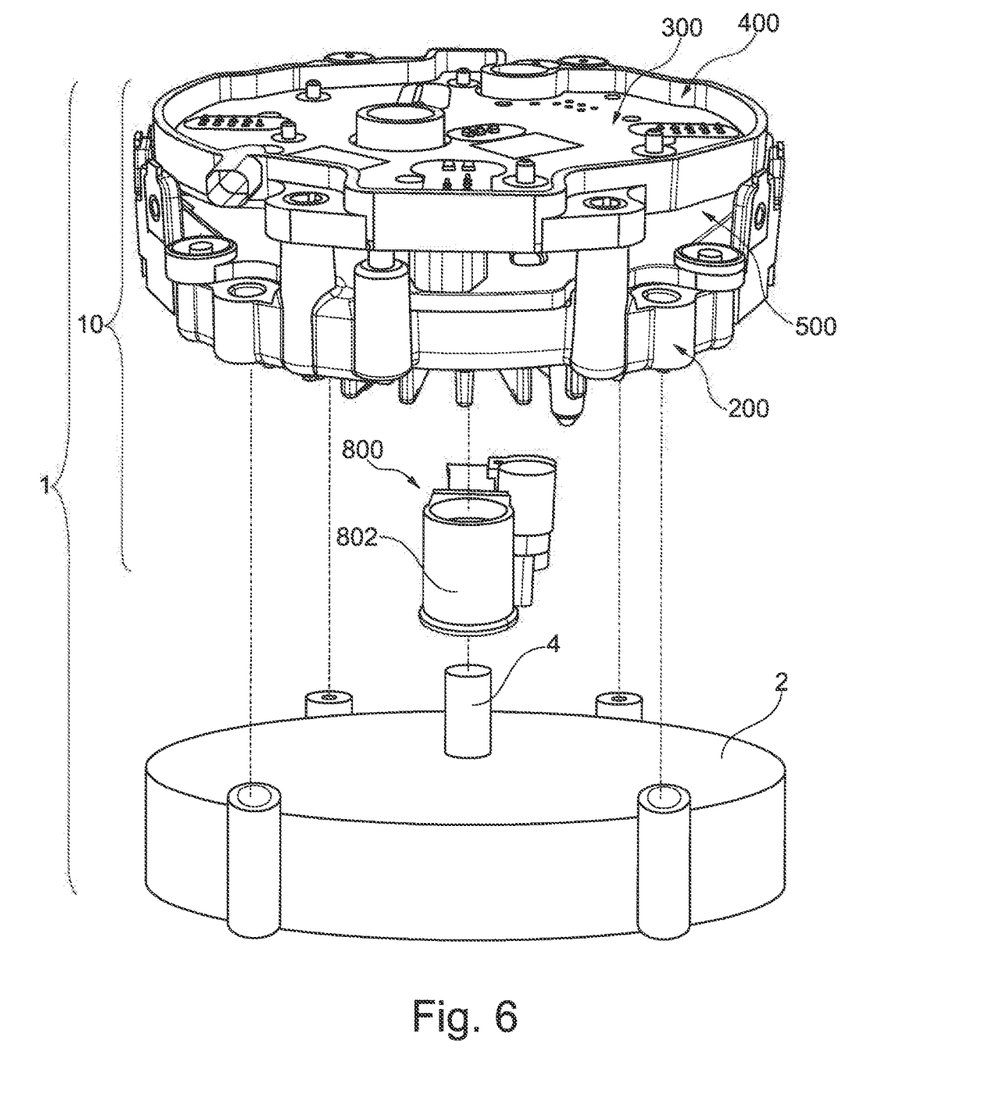
FIG. 6 is an exploded view of an electric machine according to an embodiment of the invention.

An electronic architecture according to the invention is intended to supply an electric machine for automotive vehicle, such as a rotating electric machine. In particular, FIG. 6 represents an electric machine 1 comprising an electronic architecture 10 according to an embodiment of the invention. The electronic architecture 10 is notably intended to be mounted on the casing 2 of the electric machine 1. In particular, the electronic architecture 10 is intended to be screwed to the casing 2 of the electric machine 1. However, the electronic architecture 10 might not be mounted on the casing 2 of the electric machine 1. For example, the electronic architecture 10 could be mounted on a support independent of the electric machine 1. For example, the electric machine is a starter, a starter-alternator or another machine onboard the vehicle.

Such an electronic architecture comprises at least one electronic power unit, notably intended to supply power to the electric machine 1, and an electronic control unit, notably intended to control the electronic power unit.

The electronic power unit can, for example, be one or more electronic power modules, such as illustrated in the figures. Of course, the electronic power unit is in no way limited to electronic power modules, but on the contrary the electronic power unit could be any other electronic power component intended to supply power to an electric machine.

Likewise, in the subsequent description, the electronic control unit is an electronic control board as illustrated in the figures. Of course, the electronic control unit could be any other electronic control component.

Figure 1:
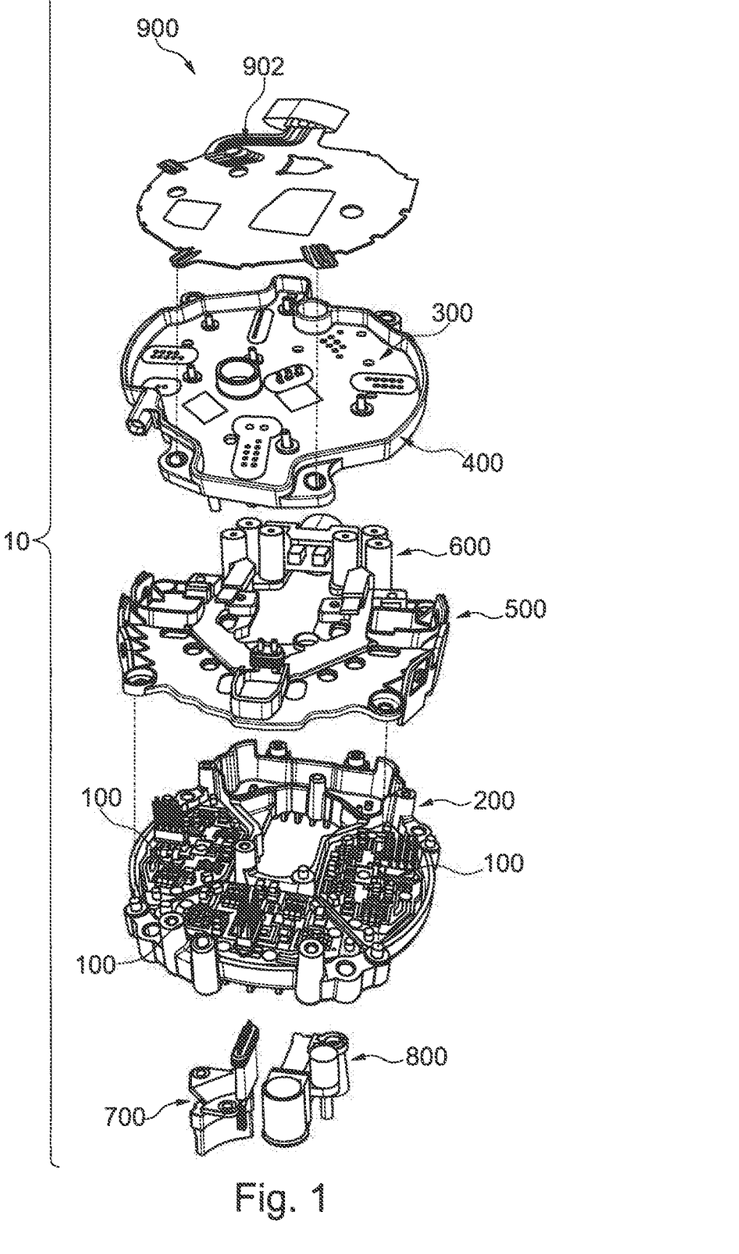
FIG. 1 is an exploded view of an embodiment of an electronic architecture according to the invention.

In particular, an electronic architecture according to an embodiment of the invention is represented in FIG. 1. The electronic architecture 10 comprises at least one electronic power module 100, here three in number, a thermal dissipator 200, an electronic control board 300, an electronic board support 400 and an electrical connector 500.

The thermal dissipator 200 supports the electronic power modules 100, and the electronic board support 400 supports the electronic control board 300. The electronic board support 400 is arranged between the electronic power modules 100 and the electronic control board 300. The electrical connector 500 is arranged between the electronic power modules 100 and the support of the electronic control board 400.

Preferably, the electronic power modules 100, the thermal dissipator 200, the electrical connector 500, the electronic control board 300 and the support 400 of the electronic board each extend along substantially parallel planes. In particular, the electronic power modules 100, the thermal dissipator 200 and the electrical connector 500 are notably superposed one above the other, as represented in FIG. 1.

Furthermore, according to the embodiment illustrated, the electronic architecture 10 advantageously comprises a capacitor bank connector 600, a sensor holder 700, a brush holder 800 and a protective cover 900. The capacitor bank connector 600 is preferably arranged between the electronic control board 300 and the electronic power modules 100, so that the connector 600 and the electronic units are superposed. The protective cover 900 is arranged opposite the electronic control board 300.

The various elements of the electronic architecture are detailed in the subsequent description.

Figure 2:
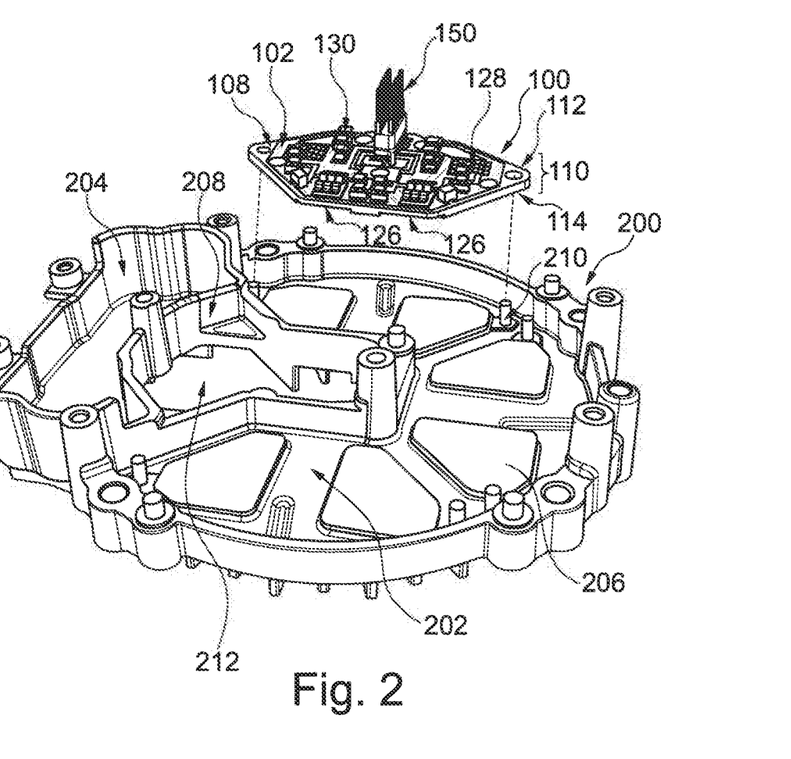
FIG. 2 is an exploded view of an electronic power unit and of a thermal dissipator according to an embodiment of the invention.

In particular, FIG. 2 represents an assembly comprising an electronic power unit, here an electronic power module 100, and a thermal dissipator 200.

The electronic power module 100 comprises a plane substrate 110, comprising an upper face 112 and a lower face 114, the lower face 114 being arranged facing the thermal dissipator 200. The plane substrate 110 comprises at least one power trace overmoulded at least in part with electrically insulating material, preferably with plastic. In particular, the plane substrate 110 of the electronic power module 100 comprises three power traces 102 overmoulded at least in part with electrically insulating material. A power trace is an electrically conducting, notably metallic, trace, for example a metallic plate, such as among others a copper plate. A power trace is notably configured to support an electric current intended to flow in the electric machine.

Each power trace 102 comprises at least one portion devoid of overmoulding, notably intended to be connected electrically to electrical elements outside the electronic power module 100, for example to electrical elements of the electric machine. For example, the first power trace is intended to be connected electrically to a phase φ of the electric machine, the second power trace is intended to be connected electrically to a positive polarity pole $B^+$ of an electrical energy source, and the third power trace is intended to be connected electrically to a negative polarity pole $B^-$ or to a reference potential, for example to the earth, of an electrical energy source.

The thickness of the plane substrate 110 is for example between 0.5 mm and 5 mm, and depends, in general, on the thickness of the power traces. For example, the thickness of the power traces is between 600 microns and 2000 microns.

Preferably, the plane substrate 110 is devoid of lateral walls extending from the plane substrate 110 and notably from the upper face 112 of the plane substrate 110, allowing a simplification of the fabrication method, as well as a saving of room within the electronic architecture.

According to a preferred embodiment, the plane substrate 110 comprises an upper part and a lower part, which are advantageously formed with continuity of substance. In particular, the upper part comprises at least one power trace 102, and the lower part comprises at least one open cavity 126, notably visible in FIG. 2. The bottom of the open cavity 126 is preferably formed at least in part by at least one portion of a power trace. The overmoulding 108 of the power traces 102 forms at least in part the edge of the open cavities 126. In particular, as represented in FIG. 2, the electronic power module 100 comprises two open cavities 126. The open cavities allow thermal dissipation notably.

As represented in FIG. 2, the electronic power module 100 comprises at least one electronic component 128, arranged on the upper face 112 of the plane substrate 110, so as to be connected electrically to one of the power traces.

The electronic power module 100 can also comprise at least one exterior connection element 130 intended to electrically connect a power trace of the electronic power module 100 to at least one electrical element outside the electronic power module 100, for example to the electrical connector 500. The exterior connection element 130 is disposed on the same face of the plane substrate 110 as the electronic component 128. The exterior connection element 130 can comprise a folded tab made of conducting material, for example in the form of a "Z", so as to comprise at least one lower plane face in contact with the plane substrate 110, notably with the power trace, and an upper plane face intended to be connected electrically to the electrical element outside the electronic power module 100, for example to the electrical connector 500.

Preferably, the mounting of the exterior connection elements 130 and of the electronic components 128 on the plane substrate 110 is achieved by depositing solder paste and then by disposing the electronic components 128 and the exterior connection elements 130 on the surface of the plane substrate 110 of the electronic power module ("SMC"). The electrically insulating material of the plane substrate 110 of the electronic module 100 is advantageously of the high temperature plastic material type, so as not to be impaired when passing the electronic module 100 to the oven for the refusion of the components. Such a method of fabricating the electronic modules makes it possible to decrease the number of links between the components of the electronic module 100, notably the electronic components 128 and the exterior connection elements 130, and thus to simplify the method for fabricating and assembling the electronic modules.

Moreover, mounting the electronic components 128 and the exterior connection elements 130 directly on the plane substrate 110 allows a saving of room within the electronic architecture 10.

In particular, the electronic components 128 and/or the exterior connection elements 130 are mounted on a power trace 102. Notably, electrical contact is made with the power trace 102 through the face of the electronic component 128 or of the connection element 130 which is in contact with the power trace 102. Furthermore, each electronic component 128 can be in electrical contact with other electronic components 128, or another power trace than that on which it is mounted, notably by connection wires, also called "bonding".

The electronic power module 100 such as described above is received by the thermal dissipator 200. Indeed, the thermal dissipator 200 comprises a first part 202 forming a reception cavity for one or a plurality of electronic power modules 100, and a second part 204 detailed by the subsequent description.

The thermal dissipator 200 is configured to allow thermal and electrical conduction, notably for earth pickup and heat dissipation. The first part 202 comprises a bottom from which there extends in a substantially perpendicular manner at least one protuberance 206 of the thermal dissipator 200. The at least one open cavity 126 of the electronic power module 100 is intended to receive at least one protuberance 206.

The at least one protuberance 206 is intended to be covered with a thermally conducting and electrically insulating material, for example a thermal grease. The at least one protuberance 206 is in contact with the bottom of each cavity 126 of the electronic power module 100. In particular, the electronic power module 100 is supported mechanically by the at least one protuberance 206. Stated otherwise, the electronic power module 100 is intended to bear on the protuberances 206 of the thermal dissipator 200, so that a space between the electronic power module 100 and the remainder of the bottom of the first part 202 of the thermal dissipator 200 results therefrom. Mechanical contact is thus ensured between the electronic power module 100 and the protuberance 206 so as to allow efficient thermal dissipation of the electronic power module 100.

Furthermore, the first part 202 of the thermal dissipator 200 can comprise positioning elements 210 intended to position the electronic modules 100 on the thermal dissipator 200 in a predetermined position. These positioning elements 210 make it possible to facilitate and guarantee correct and fast positioning of the electronic modules 100 on the thermal dissipator 200.

Figure 5:
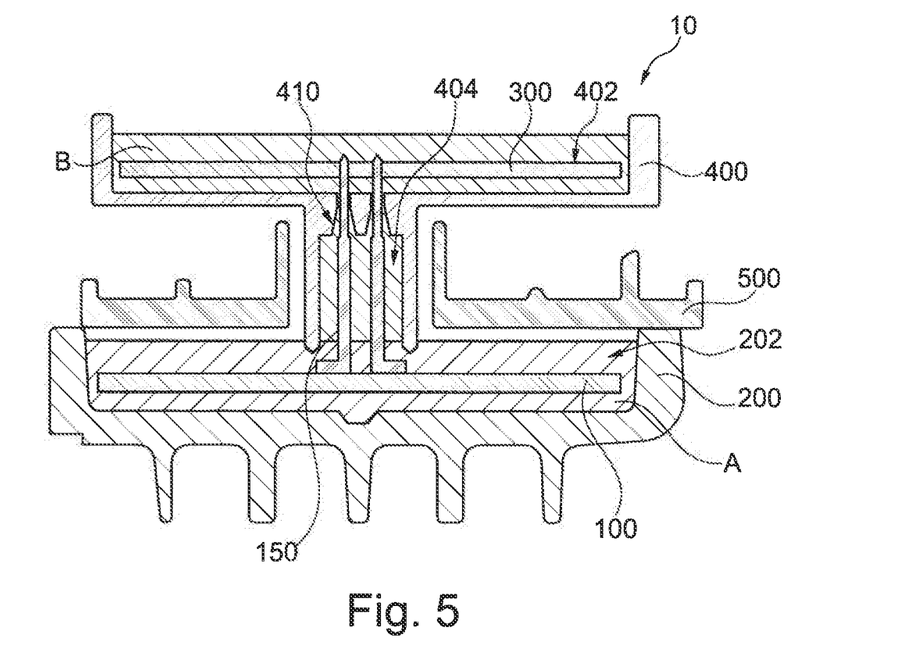
FIG. 5 is a sectional view of an electronic architecture of FIG. 1 according to an embodiment of the invention.

Advantageously, the first part 202 of the thermal dissipator 200 is intended to be filled with an insulating material A, notably visible in FIG. 5, so that the electronic power module 100 is embedded in the insulating material A. The insulating material can be an insulating gel, for example a silicone gel, or an insulating resin, for example an epoxy resin. Thus, this configuration allows efficient insulation of the electronic modules 100.

The power modules 100 are fixed to the thermal dissipator 200, for example glued on the bottom of the first part 202 of the thermal dissipator 200, so as to allow thermal transfer between the power modules 100 and a cooling circuit (not represented), in order to dissipate the heat generated by the electronic modules 100.

Furthermore, the electronic architecture 10 comprises at least one electrical connection element 150 configured to electrically connect an electronic power module 100 to the electronic control board. Each electrical connection element 150 is preferably disposed on the plane substrate 110 of the electronic power module 100 which supports it, such as represented in FIG. 2, and is intended to be connected electrically to the electronic control board.

Advantageously, at least one space extends between the electronic power modules 100 and the support of the electronic board and around the at least one electrical connection element 150. In particular, the electrical connector 10 extends at least in part in the said space. Stated otherwise, the electrical connector 10 is situated between the electronic power modules 100 and the support of the electronic board, and around the electrical connection elements 150. More precisely, the electrical connector 10 comprises through orifices, detailed subsequently, configured to receive the electrical connection elements, so that a part of the space results on either side of the electrical connector. This space is advantageously configured to allow air circulation.

Figure 3:
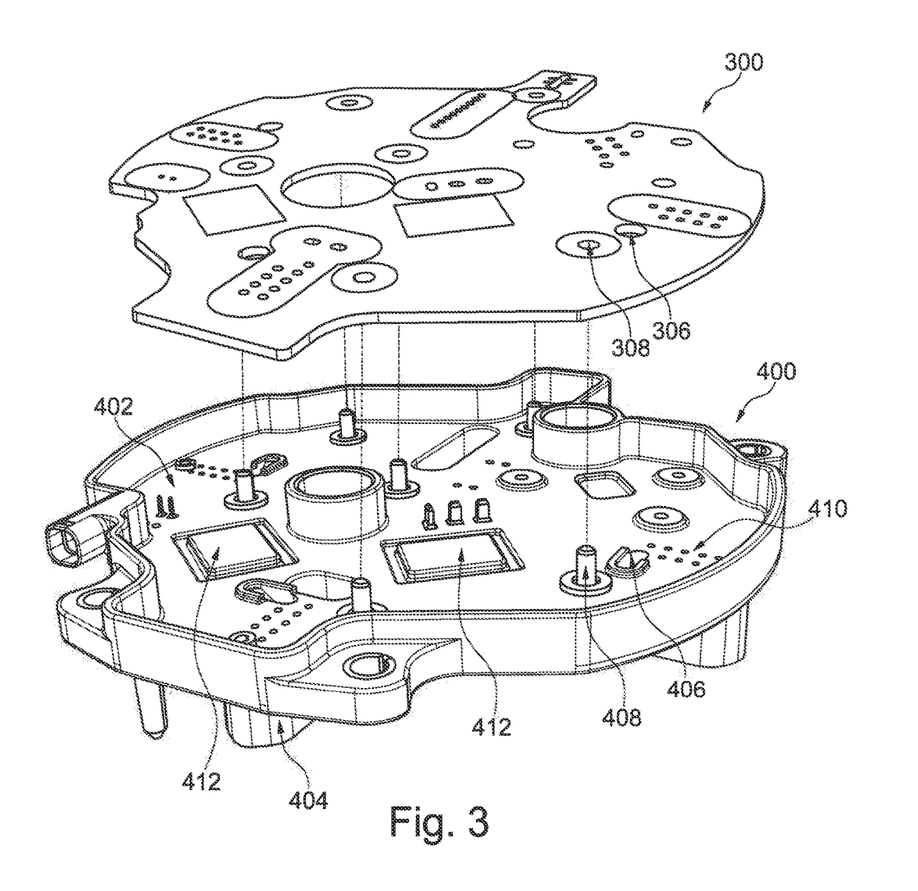
FIG. 3 is an exploded view of an electronic control unit and of a support of the said electronic unit according to an embodiment of the invention.

FIG. 3 represents an assembly comprising the electronic control unit, here an electronic control board 300, and the support 400 of the said electronic board. Notably, the electronic control board 300 is welded to the support 400.

The support 400 of the electronic board is preferably made of insulating substance, for example moulded from plastic. The support 400 comprises an open cavity 402 having a bottom on which the electronic board 300 is received.

The open cavity 402 is intended to be filled with an insulating material so that the electronic control board 300 is embedded in the insulating material. For example, as represented in FIG. 5, the electronic board is embedded in an insulating material B. The electronic control board 300 is thus insulated in an efficient manner.

The support 400 also comprises at least one hollow column 404 into which the at least one electrical connection element 150 of the electronic board 300 with the electronic modules 100 is inserted. The hollow column 404 extends from the open cavity 402 and is configured to communicate with the open cavity 402 at a first end of the hollow column 404. In particular, the support 400 of the electronic board can comprise a plurality of hollow columns, each hollow column being intended to receive the electrical connection elements 150 of each electronic module 100 with the electronic control board 300.

Advantageously, the support 400 of the electronic board can comprise a channel 406, also called filling element of the hollow column 404. Of course, the support 400 can comprise a plurality of channels 406, each channel 406 being associated with a hollow column 404. For example, in FIG. 3, the support 400 of the electronic board comprises three channels 406, each channel 406 allowing respectively the filling of a hollow column 404.

Preferentially, the channel 406 has a general ramp shape, for example a helical shape. One end of the channel 406 communicates with the bottom of the open cavity 402 and another end of the channel 406 communicates with a lateral wall of the hollow column 404. The channel 406 thus allows fast and fairly unencumbered access to the interior of the hollow column 404.

The hollow column 404 is filled with insulating material B, notably by way of the channel 406 during the deposition of insulating material on the electronic control board 300 or in the open cavity 402, so that the electrical connection elements 150 are embedded in the insulating material B. The channel 406 ensures correct filling of the hollow column 404 with the insulating material B, thus making it possible to guarantee efficient electrical insulation of the electrical connection elements 150.

Advantageously, as illustrated in FIG. 5, a second end of the hollow column 404 is in contact with the insulating material A in which the electronic module 100 is embedded. This configuration makes it possible to guarantee the filling of the hollow column 404 with insulating material B, and thus to ensure efficient insulation to dust, to liquids, to gases or else to moisture of the electrical connection elements 150. The insulating material thus makes it possible to eliminate any risk of possible short-circuit at the level of the interconnection of the electronic board 300 with the electronic power modules 100.

In particular, the electronic control board 300 and the electronic power modules 100 can be insulated with identical or different insulating materials A, B, preferably an identical insulating material, notably an insulating gel.

The interface between the insulating material A of the electronic power module 100 and the insulating material B of the electronic control board 300 is notably situated inside the hollow column 404, in proximity to the second end of the hollow column 404, as represented in FIG. 5.

The space lying between the electronic board 300 and the power module 100 and extending around the electrical connection elements 150, and more precisely around the hollow columns 404, is devoid of substance, notably of insulating material. The space free of substance, notably of insulating material, has, inter alia, the effect of leaving a space free for air circulation, thus allowing cooling by convection. In particular, this configuration makes it possible to decrease the production costs of the electronic architecture, by virtue notably of a saving in insulating material. This substance free space receives at least in part the electrical connector 500.

Furthermore, the electronic control board 300 can advantageously comprise an orifice 306 arranged opposite the end of the channel 406 communicating with the bottom of the open cavity 402 for the filling of the hollow column 404 with insulating material B by way of the channel 406.

The support 400 of the electronic board preferably comprises at least one other thermal dissipator 412. For example, in FIG. 3, the support 400 comprises two thermal dissipators, allowing dissipation of the heat generated by the electronic board 300.

Furthermore, the bottom of the open cavity 402 preferably comprises positioning elements 408 intended to position the electronic board 300 on the support 400 in a predetermined position. Stated otherwise, the positioning elements 408 disposed on the support 400 of the electronic board are intended to cooperate with complementary positioning elements 308 of the electronic board 300. For example, in FIG. 3, six positioning elements 408 are represented, each comprising a cylindrical-shaped lug protruding from the bottom of the open cavity 402, in a manner perpendicular to the bottom. The six complementary positioning elements 308 of the electronic board 300 are positioning orifices preferably exhibiting a cross-section whose shape and dimensions are complementary to the shape and dimensions of the positioning elements 408, here a circular cross-section. These positioning elements 408 make it possible to position the electronic board 300 correctly and rapidly on the support 400, and thus to allow efficient electrical connection of the electronic board 300 with the electronic power modules 100.

Moreover, the bottom of the open cavity 402 advantageously comprises guidance elements 410 for guiding the at least one electrical connection element 150 arranged at the first end of the hollow column 404 and intended to guide the at least one electrical connection element 150 towards the electronic board 300. For example, in FIG. 3, the bottom of the open cavity 402 comprises three groups of guidance elements 410. The guidance elements 410 comprise guidance orifices making it possible to recentre the electrical connection elements 150 with a view to the electrical connection of the electronic module 100 with the electronic board 300, and thus to correctly connect the electronic module 100 with the electronic board 300. Preferably, as illustrated in FIG. 5, in order to allow better recentring of the electrical connection elements 150, the cross-section of the guidance orifices facing the electronic module 100 is larger than the cross-section of the guidance orifices facing the electronic board 300.

Figure 4:
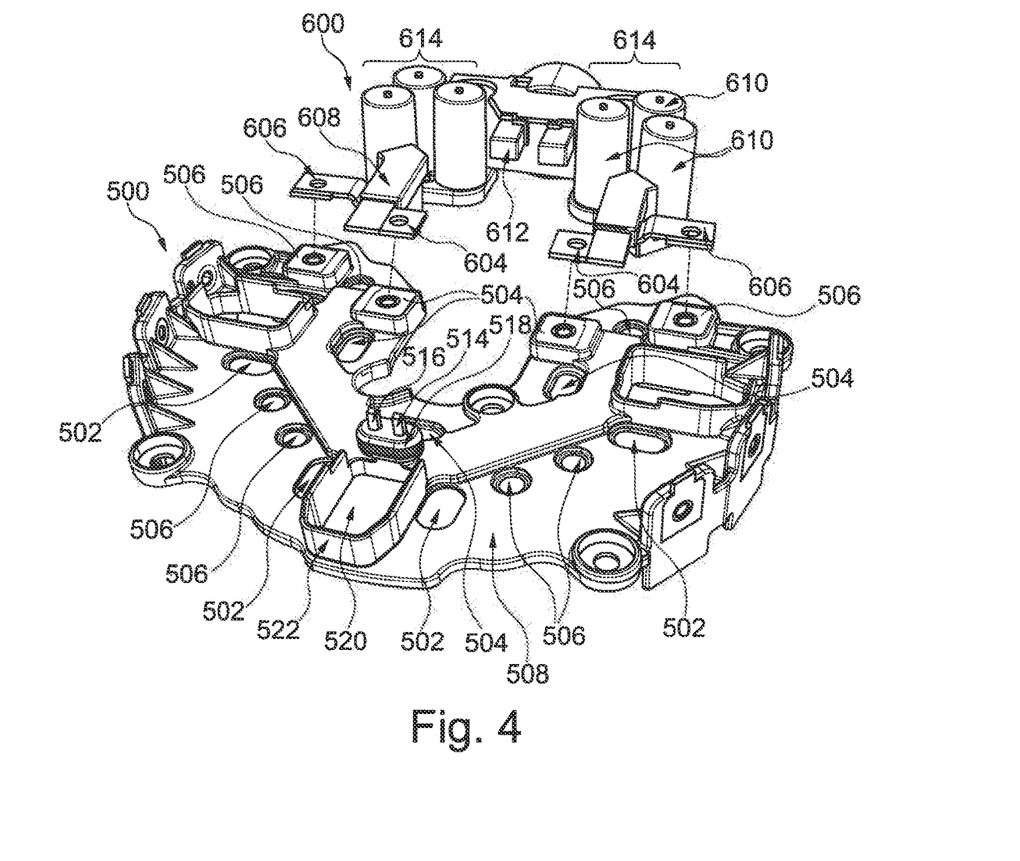
FIG. 4 represents an embodiment of an electrical connector and of a capacitor bank connector according to the invention.

The electronic architecture also comprises an electrical connector 500, notably illustrated in FIG. 4. The electrical connector 500 has a general horseshoe shape making it possible to house a brush holder of the electric machine, detailed subsequently, in the hollow of the electrical connector 500.

The electrical connector 500 preferably has a substantially plane shape and comprises at least one power trace intended to be connected electrically to at least some electrical elements of the electric machine and/or of an electrical energy source. In particular, the electrical connector 500 is configured to electrically connect the electronic power unit and/or the electronic control unit to the at least one power trace.

For example, the electrical connector 500 illustrated in FIG. 4 comprises three power traces comprised at least in part in the plane of the electrical connector 500. For example, the first power trace is intended to electrically connect an electronic power module to a phase φ of the electric machine, the second power trace is intended to be connected electrically to a positive polarity pole $B^+$ of an electrical energy source so as to supply an electronic power module and/or the electronic control board, and the third power trace is intended to be connected electrically to a negative polarity pole B⁻ or to the earth of an electrical energy source so as to supply an electronic power module and/or the electronic control board.

The power traces are overmoulded at least in part with electrically insulating material, for example with plastic. A part of the overmoulding 508 of the power traces is visible in FIG. 4.

Preferably, the second and third power traces are at least in part superposed along a direction substantially perpendicular to the plane of the electrical connector 500. Stated otherwise, the second and third power traces are at least in part disposed one above the other in the substantially plane shape of the electrical connector 500.

The second and third power traces are separated by an insulating material, in general an electrically insulating material such as for example a plastic. Preferably, the thickness of the insulating material separating the superposition of two portions of the second and third power traces is less than or equal to 2 mm, notably equal to 1 mm. Very advantageously, the thickness of the insulating material is greater than or equal to 1 micron and less than or equal to 100 microns.

Furthermore, each power trace comprises at least one terminal devoid of overmoulding, so that electrical contact can be made with an electronic power module. A terminal is preferably situated in the plane of the electrical connector 10, and is rendered accessible through a window in the electrically insulating material. The first power trace comprises two terminals 502 visible in FIG. 4, the second power trace comprises three terminals 504 and the third power trace comprises six terminals 506. The terminals 502, 504 and 506 allow electrical connection with the electronic power modules. Advantageously, the second and third power traces are totally superposed except at the level of the terminals, so as to allow electrical connection between the electrical connector and an electronic power module, while maximizing the surface of superposition of the power traces. This configuration furthermore allows a saving of room within the electrical connector.

The second and third power traces can also each comprise at least one lug, also called a pin, intended to be connected electrically to the electronic board. The lugs 514, 516 preferably extend from the plane of the electrical connector 500 in the direction of the electronic board. Advantageously, the lug of each of the second and third power traces is situated respectively at an end of the said power traces. Furthermore, the lug 514 of the second power trace can be adjacent to the lug 516 of the third power trace, as illustrated in FIG. 4, so as to facilitate connection with the electronic control board. For example, the lugs 514, 516 are adjacent and situated substantially in the middle of the electrical connector 500. Preferably, the overmoulding 508 of the second and third power traces mechanically links the lug 514 of the second power trace and the lug 516 of the third power trace. Notably, the lugs 514, 516 of the second and third power traces are made of metal.

The electrical connector 500 can also comprise a seal 518 extending between the electronic board and the electrical connector 500 and around each lug 614, 516 making it possible to guarantee leaktightness between the electrical connector 500 and the electronic board at the level of the lugs 514, 516 when insulating the electronic board with the insulating material. This seal 518 makes it possible furthermore to prevent the insulating material B from flowing around the lugs 514, 516.

Furthermore, as represented in FIG. 4, the electrical connector 500 can comprise at least one through orifice 520 intended to receive the at least one electrical connection element. Preferably, the through orifice 520 has a general cylinder shape and comprises at least one lateral wall 522 extending from the substantially plane part of the electrical connector 500 in a direction substantially perpendicular to the plane of the electrical connector 500, notably in the direction of the electronic board. Advantageously, the lateral wall 522 allows mechanical protection of the electrical connection elements.

Advantageously, the lateral wall 522 comprises at least one part of the outline of the through orifice 520, as illustrated in FIG. 4. The lateral wall 522 preferably has a height greater than or equal to 2 mm and less than or equal to 10 mm, and a thickness of less than or equal to 3 mm and greater than or equal to 0.5 mm.

The electrical connector 500 can comprise a plurality of through orifices 520, each through orifice 520 being intended to receive at least one electrical connection element for connecting the electronic control board with each electronic power module. For example, in FIG. 4, the electrical connector 500 comprises three through orifices 520, each through orifice 520 comprising a lateral wall 522.

As indicated previously, the electronic architecture 10 according to the invention advantageously comprises a capacitor bank connector 600.

The capacitor bank connector is notably supported by a second part 204 of the thermal dissipator 200 visible in FIG. 2, distinct from the first part 202 supporting the electronic power modules 100. The first and second parts 202, 204 of the thermal dissipator 200 are notably separated from one another by at least one parapet 208. The parapet 208 allows notably the insulation of the electronic power modules 100 in the first part of the thermal dissipator 200.

The electrical connector 500 and the capacitor bank connector 600 are electrically connected so as to provide power to the electronic power modules 100. The capacitor bank connector 600 can have a general horseshoe shape. In particular, the capacitor bank connector 600 and of the electrical connector 500 form the outline of an orifice intended to receive the brush holder of the electric machine.

The capacitor bank connector 600 comprises at least a fourth power trace and a fifth power trace. For example, the fourth power trace is intended to be connected electrically to a positive polarity pole B⁺ of an electrical energy source, and the fifth power trace is intended to be connected electrically to a negative polarity pole B⁻ or to the earth of an electrical energy source. The fourth and fifth power traces are distinct from one another and overmoulded at least in part with electrically insulating material, for example with plastic. For example, a part of the overmoulding 608 of the power traces is notably visible in FIG. 4.

In a manner analogous to the second and third power traces of the electrical connector 500, the fourth and fifth power traces of the capacitor bank connector are, preferably, at least in part superposed and separated by an electrically insulating material such as for example a plastic. More precisely, the power traces are at least in part disposed one above the other within the capacitor bank connector 600. For example, in FIG. 4, at least one portion of the fourth and fifth power traces are superposed along a direction substantially perpendicular to the plane of the electrical connector 500.

Furthermore, each power trace comprises at least one terminal devoid of overmoulding and which is intended to be connected electrically to the electronic power modules 100 and to the electrical connector 500 so as to provide power to the electronic modules. As illustrated in FIG. 4, the fourth power trace comprises at least one terminal 604, and the fifth power trace comprises at least one terminal 606.

Advantageously, a terminal 604 of the fourth power trace of the capacitor bank connector 600 and a terminal 504 of the second power trace of the electrical connector 500 are intended to be electrically connected, and a terminal 606 of the fifth power trace of the capacitor bank connector 600 and a terminal 506 of the third power trace of the electrical connector 500 are intended to be electrically connected.

Furthermore, the capacitor bank connector 600 can comprise at least one bank of capacitors 614 comprising at least one link capacitor 610. For example, as illustrated in FIG. 4, the capacitor bank connector 600 comprises two banks of capacitors 614 situated substantially symmetrically on the horseshoe shape of the capacitor bank connector 600, each bank of capacitors 614 comprising three link capacitors 610. The capacitor bank connector 600 electrically connects the at least one bank of capacitors 614 to the electrical connector 500.

Additionally, the capacitor bank connector 600 can comprise a ferromagnetic core, for example a magnetic torus 612 such as represented in FIG. 4, intended to measure the electric current passing through the link capacitors.

Furthermore, according to the embodiment, the electronic architecture 10 advantageously comprises at least one sensor arranged in a sensor holder 700. The sensor holder 700 is made of electrically insulating substance, for example plastic.

Preferably, the sensor holder 700 comprises a plurality of sensors, for example three hall-effect sensors, configured to measure the speed of rotation and the position of the rotor of the electric machine. The hall-effect sensors are intended to detect a magnetic field emitted by a magnetic element placed on the rotor of the electric machine, and to be connected electrically to the electronic control board 300.

In particular, the thermal dissipator 200 can comprise a through orifice 212 receiving the sensor holder 700. Preferably, the first and second parts of the thermal dissipator 200 form the outline of the through orifice 212. The sensor holder 700 is preferably screwed to the thermal dissipator 200.

Furthermore, the electronic architecture 10 preferentially comprises at least two brushes made of electrically conducting material and arranged in a brush holder 800. The brush holder 800 is made of electrically insulating substance, for example plastic.

The brushes are intended to be connected electrically to a positive polarity pole B+ and to a negative polarity pole B− of an electrical energy source, so as to allow electrical power supply of the rotor of the electric machine. For example, the brush holder 800 comprises a body 802, notably visible in FIG. 6, into which the rotor 4 of the electric machine 1 is intended to be inserted.

The brushes allow permanent electrical contact between the electronic architecture and a shaft 4 of the rotor of the electric machine. Electrical contact is made by rubbing between the brushes and the shaft 4 of the rotor of the electric machine which is mobile in rotation about an axis of the electric machine.

The brush holder 800 advantageously comprises a spring at one end of each brush making it possible to exert a tension in the direction of the shaft 4 of the rotor. More precisely, the spring makes it possible to compensate for the wear of a brush so as to allow permanent electrical contact between the brushes and the shaft 4 of the rotor.

Advantageously, the through orifice 212 of the thermal dissipator also receives the brush holder 800. This configuration allows notably a saving of room within the electronic architecture.

The brush holder is preferably screwed to the thermal dissipator 200, thereby allowing fast and easy access to the brushes, notably in case they should wear.

Advantageously, the electronic architecture 10 according to the invention comprises a protective cover 900 allowing insulation of the electronic board 300. The protective cover 900 is made of electrically insulating material, preferably plastic, and comprises at least one electrically conducting track 902, notably a copper track, configured to be connected electrically to the electronic control board 300. The track 902 furthermore allows electrical connection between the electronic architecture and the automotive vehicle in which the electric machine is intended to be integrated. This protective cover 902 thus allows a reduction in production costs, improves the adaptability of the electronic architecture to the automotive vehicle and facilitates the installation of the electronic architecture in the automotive vehicle.

The electronic architecture intended to supply an electric machine for automotive vehicle according to the invention has been described within the framework of a plurality of electronic power modules and of an electronic control board of the said electronic modules. Of course, the invention is in no way limited to the embodiment described and illustrated, which has been given merely by way of example. On the contrary, other applications of the electronic architecture in accordance with the invention are also possible without departing from the scope of the invention.

The invention claimed is:

1. An electronic architecture for supplying an electric machine for automotive vehicle, the electronic architecture comprising:
   an electronic power unit;
   a thermal dissipator supporting the electronic power unit;
   an electronic control unit configured to control the said electronic power unit;
   a support of the electronic control unit supporting the electronic control unit and arranged between the electronic power unit and the electronic control unit; and
   an electrical connector comprising at least one power trace that connects electrically to at least some electrical elements of the electric machine and/or of an electrical energy source, the electrical connector being arranged between the electronic power unit and the support of the electronic control unit and electrically connecting the electronic power unit and/or the electronic control unit to the at least one power trace,
   in which the electronic power unit, the thermal dissipator, the electrical connector, the electronic control unit and the support of the electronic control unit each extend along substantially parallel planes, the electronic power unit, the thermal dissipator and the electrical connector being superposed one above the other, and
   in which the electrical connector further comprises:
      a first power trace that electrically connects the electronic power unit to a phase of the electric machine;
      a second power trace that is connected electrically to a positive polarity pole of an electrical energy source so as to supply the electronic power unit and/or the electronic control unit; and
      a third power trace that is connected electrically to a negative polarity pole or to the earth of an electrical energy source so as to supply the electronic power unit and/or the electronic control unit.

2. The electronic architecture according to claim 1, furthermore comprising:
at least one electrical connection element electrically connecting the electronic power unit and the electronic control unit,
wherein at least one space extends between the electronic power unit and the support of the electronic control unit and around the at least one electrical connection element, the electrical connector extending at least in part in the said space around the electrical connection element.

3. The electronic architecture according to claim 2, in which the electronic power unit, the electronic control unit and the at least one electrical connection element are embedded in an insulating material, so that the at least one space extending around the at least one electrical connection element between the electronic power unit and the support of the electronic control unit is devoid of insulating material.

4. The electronic architecture according to claim 1, further comprising a capacitor bank connector supported by a second part of the thermal dissipator distinct from a first part supporting the electronic power unit.

5. The electronic architecture according to claim 4, in which the first part of the thermal dissipator is intended to be filled with an insulating material, so that the electronic power unit is embedded in the insulating material.

6. The electronic architecture according to claim 1, also comprising a protective cover arranged opposite the electronic control unit.

7. The electronic architecture according to claim 1, in which:
the electronic power unit comprises at least one electronic power module; and
the electronic control unit is an electronic control board.

8. The electric machine configured to be integrated into an automotive vehicle, comprising an electronic architecture according to claim 1.

* * * * *